(12) United States Patent
Glenn et al.

(10) Patent No.: US 6,670,698 B1
(45) Date of Patent: Dec. 30, 2003

(54) INTEGRATED CIRCUIT PACKAGE MOUNTING

(75) Inventors: Thomas P. Glenn, Gilbert, AZ (US); Steven Webster, Muntinlupa (PH); Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/068,717

(22) Filed: Feb. 5, 2002

(51) Int. Cl.[7] ............................................. H01L 23/495
(52) U.S. Cl. ................. 257/678; 257/696; 257/727; 257/730; 257/731; 257/732; 257/733
(58) Field of Search ................. 257/678, 696, 257/727, 730, 731–733

(56) References Cited

U.S. PATENT DOCUMENTS

| | | | | |
|---|---|---|---|---|
| 5,095,359 A | * | 3/1992 | Tanaka et al. ............... | 257/703 |
| 5,468,995 A | * | 11/1995 | Higgins, III ................. | 257/697 |
| 5,563,446 A | * | 10/1996 | Chia et al. ................... | 257/704 |
| 5,916,407 A | * | 6/1999 | Gruenwald et al. .......... | 442/118 |
| 5,982,633 A | * | 11/1999 | Jeansonne .................... | 361/782 |
| 6,222,265 B1 | * | 4/2001 | Akram et al. ................ | 257/723 |
| 6,392,887 B1 | * | 5/2002 | Day et al. .................... | 361/704 |
| 2001/0053567 A1 | * | 12/2001 | Akram et al. ................ | 438/127 |
| 2002/0050379 A1 | * | 5/2002 | Barrow ........................ | 174/52.1 |
| 2002/0158318 A1 | * | 10/2002 | Chen ............................ | 257/678 |
| 2002/0180013 A1 | * | 12/2002 | Brofman et al. ............. | 257/678 |

* cited by examiner

Primary Examiner—Amir Zarabian
Assistant Examiner—Ida M. Soward
(74) Attorney, Agent, or Firm—Gunnison, McKay & Hodgson, L.L.P.; Philip J. McKay (57) ABSTRACT

A packaged electronic device includes connection contacts that are formed on the contact pads on the second surface of the substrate. In contrast to the prior art, the connection contacts are not solder contacts but are formed of nickel/aluminum plated copper and are therefore harder and less malleable and subject to deformation than prior art solder balls. The connection contacts are formed to align with, and contact, attachment pads formed on the motherboard or other system component. A tension device is then used to mechanically attach the packaged electronic device of the invention to the motherboard.

18 Claims, 6 Drawing Sheets

INTEGRATED CIRCUIT PACKAGE MOUNTING

BACKGROUND OF THE INVENTION

1. Field of the Invention

The present invention relates generally to the packaging of electronic components. More particularly, the present invention relates to packaged electronic components and package mounting.

2. Description of the Related Art

Prior art methods and structures for packaging an electronic device, such as an integrated circuit, typically began with mounting the electronic device to a substrate. The substrate typically included conductive traces with bond pads formed on a top surface of the substrate. The prior art electronic devices were then attached to the conductive traces via the bond pads on the substrate using wire bonding, flip-chip, or various other well-known connection methods. The conductive traces on the top surface of the substrate were typically connected to solder ball pads on a bottom surface of the substrate by way of electrically conductive vias.

Once the prior art electronic device was attached to the substrate, the electronic device, and at least a portion of the substrate, were encased using various well know techniques including over molding, injection molding or by various other structures and/or methods.

According to the prior art, once the electronic device and substrate were attached and encased together, solder balls were formed on the solder ball pads on the bottom surface of the substrate. According to the prior art teachings, the solder balls formed on the bottom surface of the substrate were then re-flowed, i.e., re-melted, to attach the prior art packaged electronic device to attachment pads on a motherboard or other system component.

The prior art structure and method discussed above required not only the formation of solder balls on the bottom surface of the substrate, but also the re-flowing of the solder balls to either attach or remove the prior art packaged electronic device from the motherboard or other system component. This, in turn, meant that the installation and/or removal of prior art packaged electronic devices from the motherboard or other system component required special equipment and procedures. Consequently, the attachment and/or removal of prior art packaged electronic devices was difficult to perform in the field and relatively expensive.

In addition, the solder balls themselves used with prior art packaged electronic components were also expensive to form and required special equipment and procedures to make. The solder balls were also very fragile and very susceptible to environmental conditions and, in particular, change in temperature. In addition, the connections formed by the solder balls were also sensitive and easily broken. Thus, the solder balls used to connect prior art packaged electronic devices to motherboards or other system components were expensive to make, easily broken, and, to make matters worse, made the inevitable replacement of prior art packaged electronic devices difficult, time consuming and expensive.

What is needed is a simpler, less expensive, more reliable and more field accessible method and structure for connecting packaged electronic devices to a motherboard or larger system component.

SUMMARY OF THE INVENTION

In accordance with one embodiment of the present invention, a packaged electronic device includes an electronic device, such as an integrated circuit, electrically coupled to a substrate. In one embodiment of the invention, the substrate includes conductive traces with bond pads formed on a top, or first, surface of the substrate. According to one embodiment of the invention, the electronic devices are then attached to the conductive traces via the bond pads on the substrate using wire bonding, flip-chip, or various other well-known connection methods. In one embodiment of the invention, the conductive traces on the first surface of the substrate are connected to contact pads formed on a bottom, or second, surface of the substrate by way of electrically conductive vias.

According to one embodiment of the invention, once the electronic device is attached to the substrate, the electronic device, and at least a portion of the substrate, are encased using various well known techniques including over molding, injection molding or by various other structures and/or methods.

According to one embodiment of the invention, connection contacts are then formed on the contact pads on the second surface of the substrate. According to one embodiment of the invention, and in contrast to the prior art, the connection contacts are typically not solder contacts but are formed of hard metal or metal alloys such as nickel/aluminum plated copper and are therefore harder, less malleable and less subject to deformation than prior art solder balls.

In addition, according to one embodiment of the invention, and in contrast to the prior art, the connection contacts are not "balls" but are formed to have relatively wide bases at the contact pads and points on the opposite ends. In one embodiment of the invention, the connection contacts are formed to be substantially conical in shape with a relatively wide base at the contact pad and a relatively narrow point at the opposite end. In one embodiment of the invention, the connection contacts are formed to be substantially pyramid shaped with a relatively wide base at the contact pad and a relatively narrow point at the opposite end. In one embodiment of the invention, the connection contacts are formed to be substantially column shaped. In one embodiment of the invention, the connection contacts are formed to be substantially square or rectangular shaped. In one embodiment of the invention, the connection contacts are formed to be substantially spherical shaped or any other shape desired or considered advantageous in a particular structure.

According to one embodiment of the invention, the connection contacts formed on the contact pads of the second surface of the substrate of the packaged electronic device of the invention are formed to align with, and contact, attachment pads formed on a second system component such as a motherboard or other system component. In addition, according to one embodiment of the invention, the packaged electronic device of the invention includes a tension device for mechanically attaching, i.e., attaching by static pressure and friction, the packaged electronic device of the invention to the second system component. According to one embodiment of the invention, the tension device applies a pressure on the packaged electronic device and maintains contact between the connection contacts of the packaged electronic device of the invention and the attachment pads of the second system component or larger system component.

As discussed above, the prior art structures and methods required not only the formation of solder balls, but also the re-flowing of the solder balls to either attach or remove the prior art packaged electronic device from the second system component such as a motherboard or other system component. Consequently, the attachment and/or removal of prior art packaged electronic devices was difficult to perform in the field, relatively expensive and the electrical contacts so formed were unreliable, sensitive and easily broken.

In contrast, according to the invention, the packaged electronic devices are statically attached to the motherboard, or any other second system component, without the use of solder balls or the need to re-flow solder. Therefore, using the method and structure of the invention, there is no need for specialized equipment to attach or remove packaged electronic devices and these procedures can be performed easily in the field.

In addition, the electrical connection contacts of the invention are more rugged and less susceptible to environmental conditions than prior art structures and methods and therefore the method and structure of the invention allows for greater reliability and results in a more robust system. Consequently, the invention provides a simpler, less expensive, more reliable and more field accessible method and structure for connecting packaged. electronic devices to a motherboard or other second system component than the methods and structures of the prior art.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

In accordance with one embodiment of the present invention, a packaged electronic device (100 in FIGS. 1, 2A and 5A; 300 in FIGS. 3, 4 and 6A) includes an electronic device (110 in FIGS. 1, 2A and 5A; 310 in FIGS. 3, 4 and 6A), such as an integrated circuit, electrically coupled to a substrate (101 in FIGS. 1, 2A, 2B, 5A and 5B; 301 in FIGS. 3, 4, 6A and 6B). In one embodiment of the invention, the substrate includes conductive traces (103 in FIGS. 1, 2A and 5A; 303 in FIGS. 3, 4 and GA) with bonding locations (180 in FIGS. 1 and 2A) formed on a top, or first, surface (109 in FIGS. 1, 2A, 2B and 5A; 309 in FIGS. 3, 4 and 6A) of the substrate. According to one embodiment of the invention, the electronic devices are then attached to the conductive traces via the bonding locations on the substrate using wire bonding, flip-chip, or various other well-known connection methods. In one embodiment of the invention, the conductive traces on the first surface of the substrate are connected to contact pads (107 in FIGS. 1, 2A, 2B, 5A and 5B; 307 in FIGS. 3, 4, 6A and 6B) formed on a bottom, or second, surface (108 in FIGS. 1, 2A, 2B, 5A and 5B; 308 in FIGS. 3, 4, 6A and 6B) of the substrate by way of electrically conductive vias (105 in FIGS. 1, 2A and 5A; 305 in FIGS. 3, 4 and GA).

According to one embodiment of the invention, once the electronic device is attached to the substrate, the electronic device, and at least a portion of the substrate, are encased in encapsulant (129 in FIGS. 1, 2A, 2B and 5A; 329 in FIGS. 3, 4 and GA) using various well known techniques including over molding, injection molding or by various other structures and/or methods.

According to one embodiment of the invention, connection contacts (120 in FIGS. 1, 2A, 2B; 520 in FIGS. 5A and 5B; 320 in FIGS. 3, 4; and 620 in FIGS. 6A and 6B) are then formed on the contact pads on the second surface of the substrate. According to one embodiment of the invention, and in contrast to the prior art, the connection contacts are typically not solder contacts but are formed of hard metal such as nickel/aluminum plated copper and are therefore harder, less malleable and less subject to deformation than the solder balls of the prior art.

In addition, according to one embodiment of the invention, and in contrast to the prior art, the connection contacts are not solder "balls" but are formed to have relatively wide bases (160 in FIGS. 1 and 2B) at the contact pads and points (161 in FIGS. 1 and 2B) on the opposite ends. In one embodiment of the invention, the connection contacts are formed to be substantially conical in shape with a relatively wide base at the contact pad and a relatively narrow point at the opposite end. In one embodiment of the invention, the connection contacts are formed to be substantially pyramid shaped with a relatively wide base at the contact pad and a relatively narrow point at the opposite end. In one embodiment of the invention, the connection contacts are formed to be substantially column shaped. In one embodiment of the invention, the connection contacts are formed to be substantially square or rectangular shaped. In one embodiment of the invention, the connection contacts are formed to be substantially spherical shaped or any other shape desired or considered advantageous in a particular structure or application.

Figure 4:
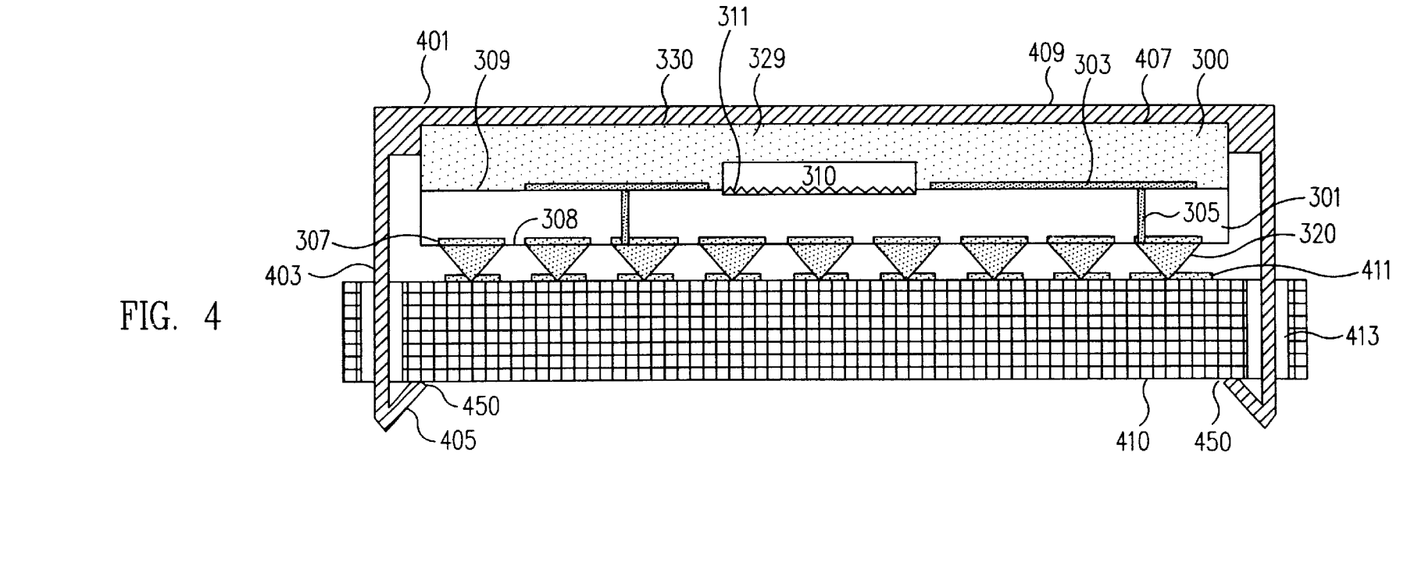
FIG. 4 shows an enlarged cross-sectional view of the packaged electronic device of FIG. 3 coupled to a motherboard, or other second system component, in accordance with the principles of one embodiment of the invention.
Figure 5A:
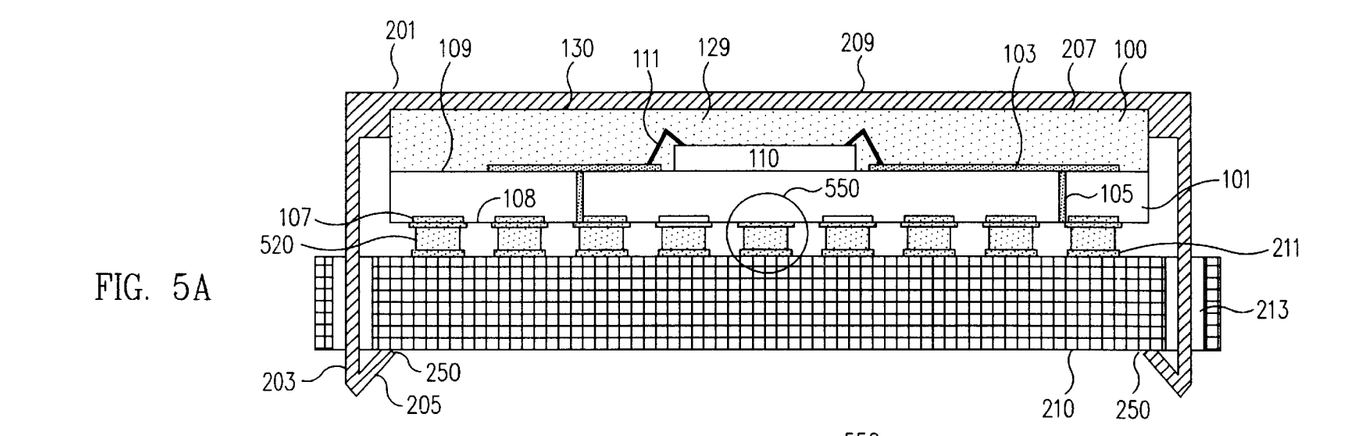
FIG. 5A shows an enlarged cross-sectional view of another embodiment of a packaged electronic device of the invention coupled to a motherboard, or other second system component, in accordance with the principles of one embodiment of the invention.
Figure 5B:
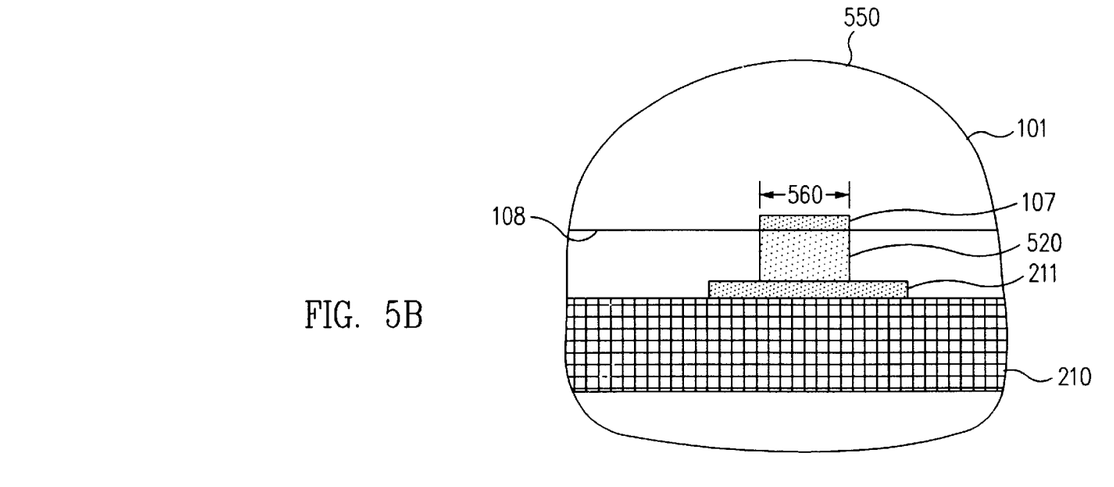
FIG. 5B shows a close up and detailed view of a portion of the structure shown FIG. 5A.
Figure 6A:
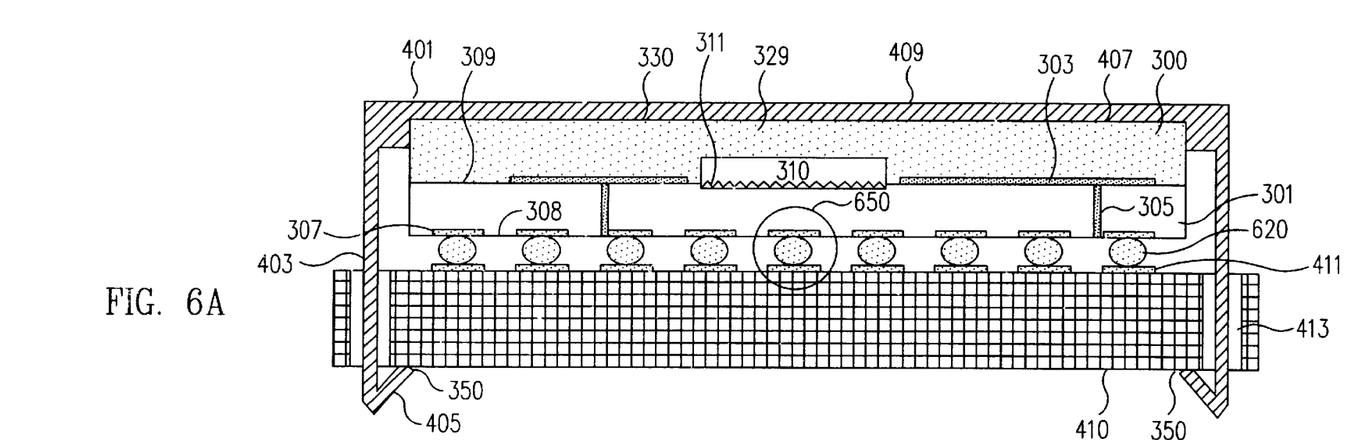
FIG. 6A shows an enlarged cross-sectional view of another embodiment of a packaged electronic device of the invention coupled to a motherboard, or other second system component, in accordance with the principles of one embodiment of the invention.

According to one embodiment of the invention, the connection contacts formed on the contact pads of the second surface of the substrate of the packaged electronic device of the invention are formed to align with, and contact, attachment pads (211 in FIGS. 2A, 2B 5A and 5B; 411 in FIGS. 4, 6A and GB) formed on the motherboard or other second system component (210 in FIGS. 2A, 2B 5A and 5B; 410 in FIGS. 4, 6A and GB).

In addition, according to one embodiment of the invention, the packaged electronic device of the invention includes a tension device (201 in FIGS. 2A and 5A; 401 in FIGS. 4 and 6A) for mechanically attaching, i.e., attaching by static pressure and friction, the packaged electronic device of the invention to the second system component. According to one embodiment of the invention, the tension device applies a pressure on the packaged electronic device and maintains contact between the connection contacts of the packaged electronic device of the invention and the attachment pads of the motherboard or other second system component.

As discussed above, the prior art structures and methods required not only the formation of solder balls, but also the re-flowing of the solder balls to either attach or remove the prior art packaged electronic device from the motherboard or other second system component. Consequently, the attachment and/or removal of prior art packaged electronic devices was difficult to perform in the field, relatively expensive and unreliable. As also discussed above, the prior art solder balls themselves were very fragile and very susceptible to environmental conditions and changes in temperature. In addition, the connections formed by the prior art solder balls were also sensitive and easily broken.

In contrast, according to the invention, the packaged electronic devices are statically attached to the motherboard, or any other second system component, without the use of solder balls or the need to re-flow solder. Therefore, using the method and structure of the invention, there is no need for specialized equipment to attach or remove packaged electronic devices and these procedures can be performed easily in the field.

In addition, the electrical connection contacts of the invention are more rugged and less susceptible to environmental conditions than prior art structures and methods and, therefore, the method and structure of the invention allows for greater reliability and results in a more robust system. Consequently, the invention provides a simpler, less expensive, more reliable and more field accessible method and structure for connecting packaged electronic devices to a motherboard or other second system component than the methods and structures of the prior art.

Figure 1:
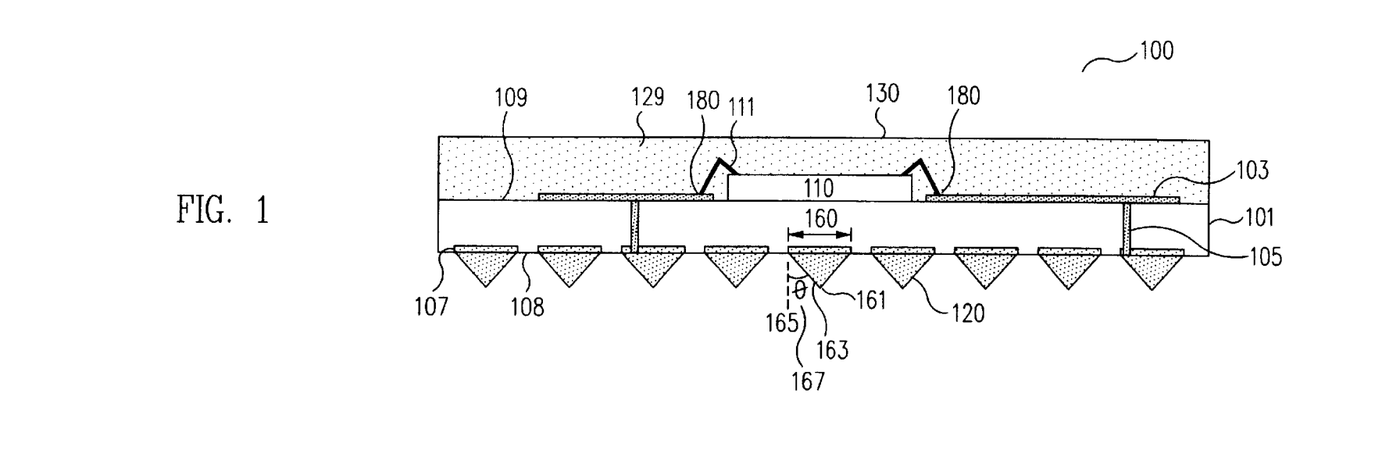
FIG. 1 shows an enlarged cross-sectional view of one embodiment of a packaged electronic device in accordance with the principles of the present invention.

FIG. 1 shows an enlarged cross-sectional view of a packaged electronic device 100 in accordance with one embodiment of the present invention. Packaged electronic device 100 includes an electronic device 110, such as an integrated circuit, a discrete component, a sensor die, or any one of numerous other well-known passive or active devices, electrically coupled to a substrate 101. Substrate 101 has a top, or first, surface 109 and a bottom, or second, surface 108. In one embodiment of the invention, substrate 101 includes conductive traces 103 with bonding locations 180 formed on first surface 109 of the substrate 101.

According to the one embodiment of the invention shown in FIG. 1, electronic device 110 is attached to conductive traces 103, via the bonding locations 180 on substrate 101 using wire bonding and bond wires 111. Wire bonding methods and structures are well known in the art and are not discussed in further detail herein to avoid detracting from the invention.

In one embodiment of the invention, conductive traces 103 on top surface 109 of substrate 101 are connected to contact pads 107 formed on second surface 108 of substrate 101 by way of electrically conductive vias 105. Methods and structures for forming contact pads 107 and electrically conductive vias 105 are well known in the art and are not discussed in further detail herein to avoid detracting from the invention.

According to one embodiment of the invention, once electronic device 110 is attached to substrate 101 and electrically connected to conductive traces 103 by bond wires 111, electronic device 110, bond wires 111 and at least a portion of first surface 109 of substrate 101, are encased in encapsulant 129 using various well known techniques and materials including over molding, injection molding or by various other structures and/or methods well known to those of skill in the art. In another embodiment of the invention, once electronic device 110 is attached to substrate 101 and electrically connected to conductive traces 103 by bond wires 111, electronic device 110, bond wires 111 and at least a portion of first surface 109 of substrate 101, are encased in an enclosure (not shown) such as a ceramic enclosure or "snap" enclosure using various methods and structures well known in the art.

According to one embodiment of the invention, connection contacts 120 are then formed on contact pads 107 on second surface 108 of substrate 101. According to one embodiment of the invention, and in contrast to the prior art, connection contacts 120 are typically not solder contacts but are formed of hard metal such as nickel/aluminum plated copper and are therefore harder, less malleable and less subject to deformation than the solder balls of the prior art.

In addition, according to one embodiment of the invention, and in contrast to the prior art, the connection contacts 120 are not solder "balls" but are formed to have relatively wide bases 160 at contact pads 107 and points 161 on the opposite ends. In this embodiment of the. invention, a side 163 of a connection contact 120 is at an angle 167 to a line 165 perpendicular to second surface 108 of substrate 101. As discussed in more detail below, in other embodiments of the invention, connection contacts 120 are formed to be substantially cone, pyramid, column, sphere shaped or any other shape desired or considered advantageous in particular structure.

Figure 2A:
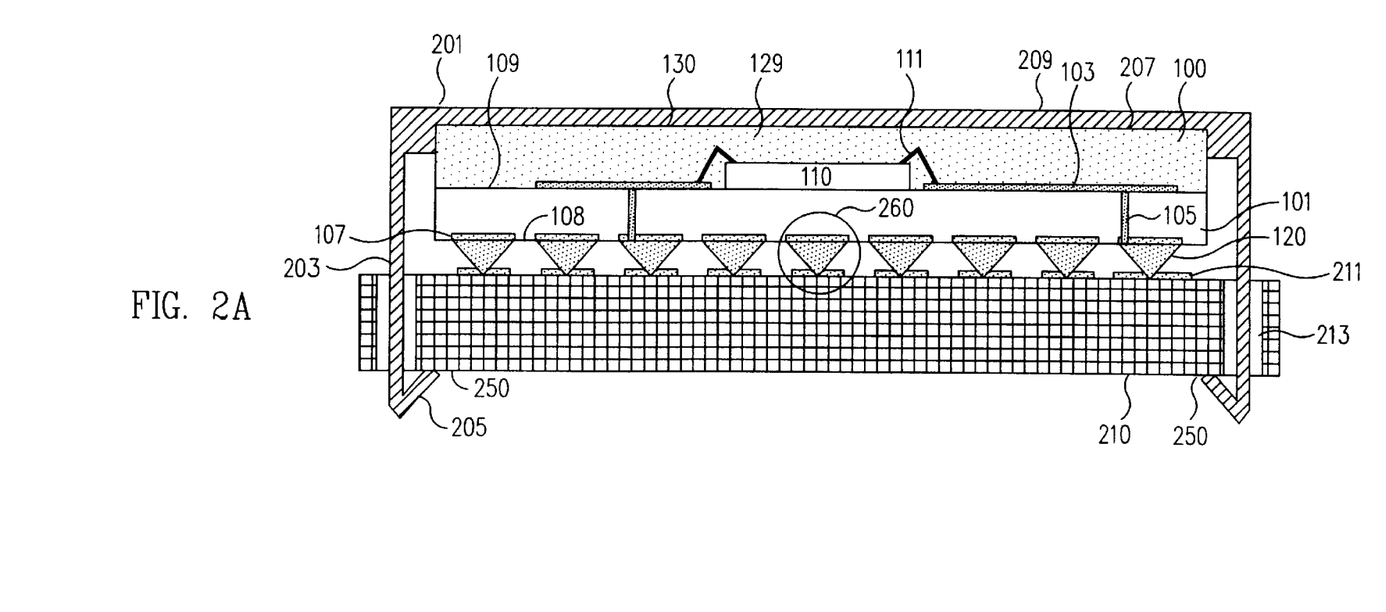
FIG. 2A shows an enlarged cross-sectional view of the packaged electronic device of FIG. 1 coupled to a motherboard, or other second system component, in accordance with the principles of one embodiment of the invention.

FIG. 2A shows an enlarged cross-sectional view of packaged electronic device 100 coupled to a second system component 210, such as a motherboard or other system component, in accordance with one embodiment of the invention. As seen in FIG. 2A, connection contacts 120 formed on contact pads 107 of second surface 108 of substrate 101 of packaged electronic device 100 are formed to align with, and contact, attachment pads 211 formed on second system component 210.

In addition, according to the invention, packaged electronic device 100 is coupled to second system component 210 with a tension device 201. According to the invention, tension device 201 is used for mechanically attaching, i.e., attaching by static pressure and friction, packaged electronic device 100 of the invention to the second system component 210 by providing downward pressure on first surface 130 of packaged electronic device 100. Tension device 201 thereby maintains contact between connection contacts 120 of packaged electronic device 100 and attachment pads 211 of second system component 210. In one embodiment of the invention, tension device 201 includes contact portion 207 that contacts and applies pressure to first surface 130 of packaged electronic device 100. In one embodiment of the invention, tension device 201 also includes sides 203 and anchor portions 205. According to one embodiment of the invention, second system component 210 includes holes 213 through which anchors 205 and a portion of sides 203 pass. Anchors 205 then contact surfaces 250 and clip tension device 201 to motherboard 210. Tension device 201 thereby holds packaged electronic device 100 in place and forces contact between contacts 120 of packaged electronic device 100 and attachment pads 211 of second system component 210.

Figure 2B:
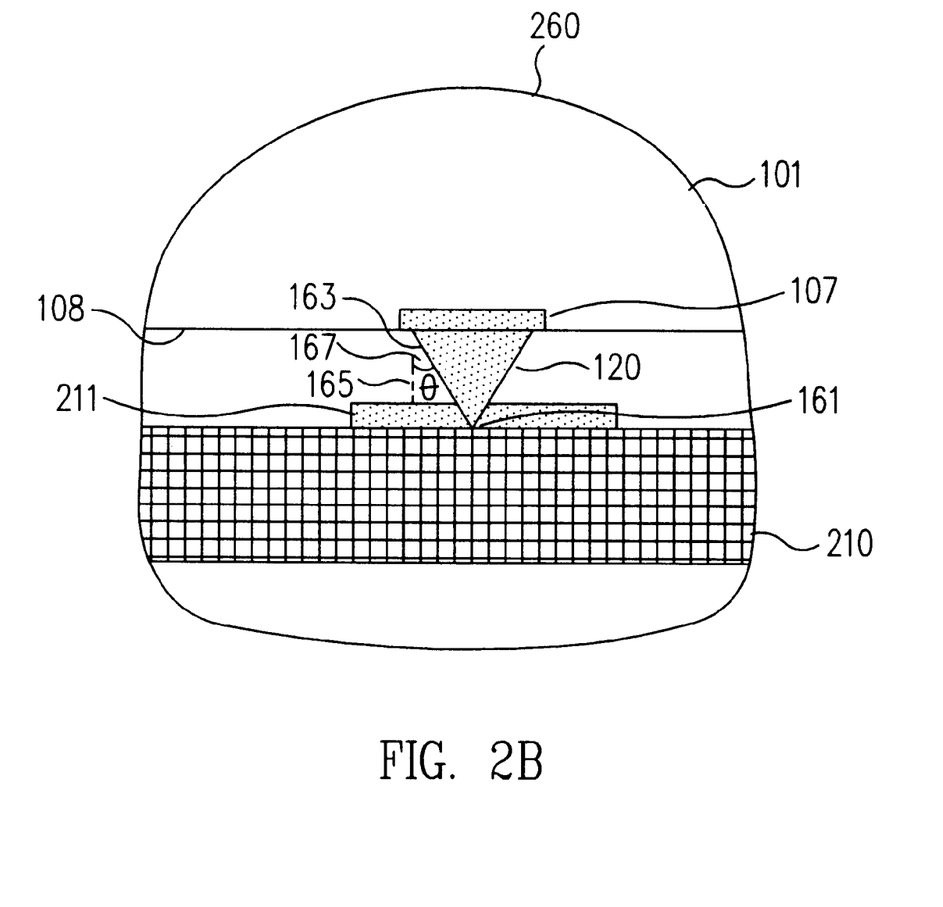
FIG. 2B shows a close up and detailed view of a portion of the structure shown FIG. 2A.

FIG. 2B shows a close up and detailed view of portion 260 in FIG. 2A. As shown in FIGS. 2A and 2B, in one embodiment of the invention, point 161 is held in contact with, and in one embodiment extends into, attachment pad 211 by tension device 201. In one embodiment of the invention, attachment pads 211 are formed of relatively soft material such as gold. In other embodiments of the invention, attachment pads 211 are formed of any electrically conductive material such as copper or nickel/aluminum plated copper.

Figure 2C:
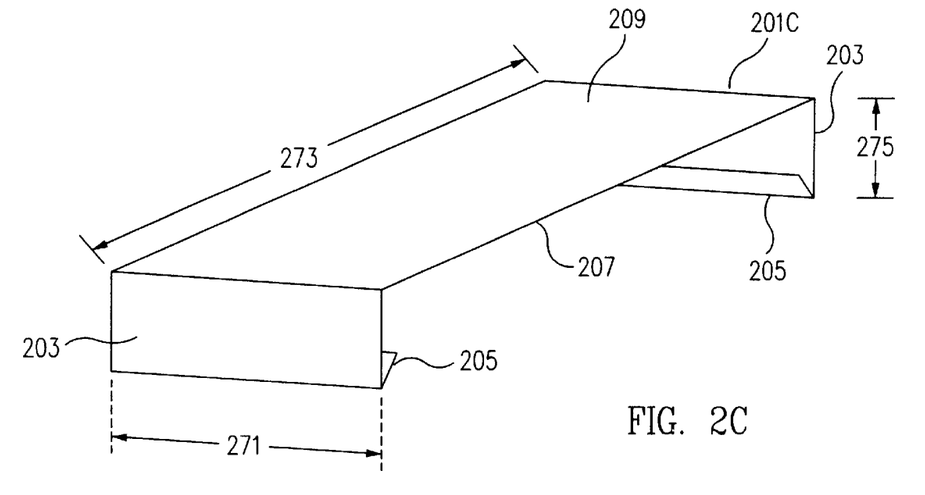
FIG. 2C shows a perspective view of one embodiment of a tension device in accordance with the principles of the invention.

FIG. 2C shows a perspective view of one embodiment of a tension device 201C in accordance with the principles of the invention. As seen in FIG. 2C, tension device 201C includes: top or upper surface 209; contact portion 207, that contacts and applies pressure to first surface 130 of packaged electronic device 100 (FIG. 2A); and sides 203 with anchor portions 205.

One embodiment of tension device 201C includes two sides 203 each of which have a width 271 and a height 275. In one embodiment of the invention, anchor portions 205 also have width 271. Consequently, in some embodiments of the invention using a tension device such as tension device 201C, holes 213 in FIG. 2A, through which anchors 205 and a portion of sides 203 pass, are actually elongated holes or channels also having widths 271.

Figure 2D:
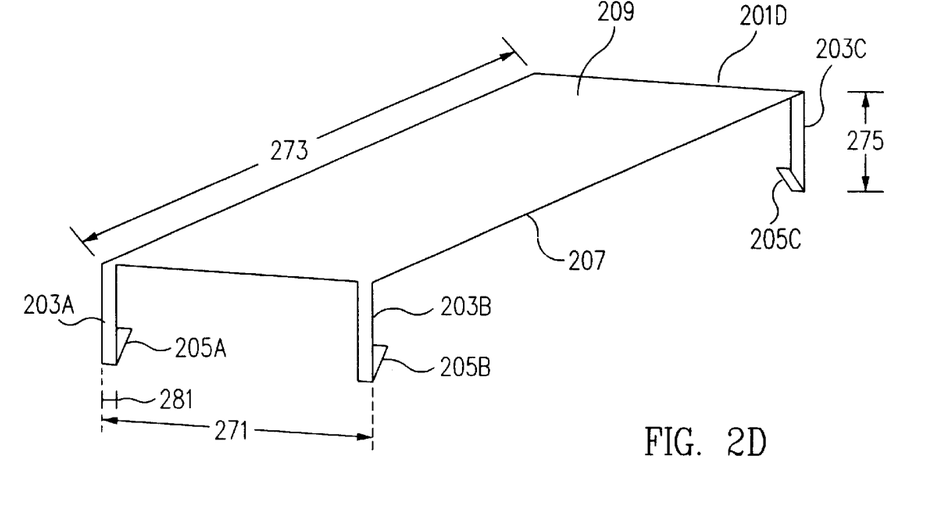
FIG. 2D shows a perspective view of one embodiment of a tension device in accordance with the principles of the invention.

FIG. 2D shows a perspective view of one embodiment of a tension device 201D in accordance with the principles of the invention. As seen in FIG. 2D, tension device 201D includes: top or upper surface 209; contact portion 207, that contacts and applies pressure to first surface 130 of packaged electronic device 100 (FIG. 2A); and attachment portions 203A, 203B, 203C and 203D with anchor portions 205A, 205B, 205C and 205D, respectively. One embodiment of tension device 201D includes attachment portions 203A, 203B, 203C and 203D each of which have a width 281 and a height 275. In this embodiment of the invention, anchor portions 205A, 205B, 205C and 205D also have width 281. Consequently, in some embodiments of the invention using a tension device such as tension device 201D, four holes 213 in FIG. 2A, through which anchors 205A, 205B, 205C and 205D and a portion of sides 203A, 203B, 203C and 203D pass, are required.

In one embodiment of the invention, tension device 201, 201C, 201D is formed of a metal having a relatively stiff structure and spring like quality. In other embodiments of the invention, tension device 201 is made of plastic, epoxy resin, various polymers or any other material that is relatively rigid but flexible and can provide a downward pressure.

Although the embodiments of the invention discussed above with respect to FIGS. 1, 2A, 2B show a wire bond method for attaching electronic device 110 to substrate 101 with bond wires 111, those of skill in the art will readily recognize that other methods and structures for attaching electronic device 110 to substrate 101 could be used with the invention such as flip-chip methods (see FIGS. 3 and 4 discussed below).

Figure 3:
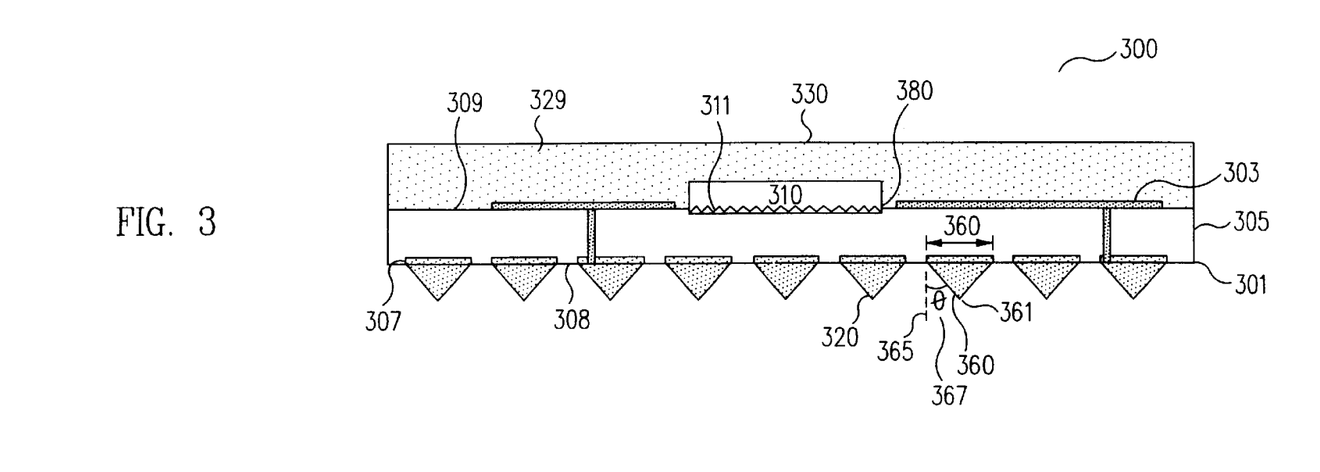
FIG. 3 shows an enlarged cross-sectional view of another embodiment of a packaged electronic device in accordance with the principles of the present invention.

FIG. 3 shows an enlarged cross-sectional view of a packaged electronic device 300 in accordance with another embodiment of the present invention. Packaged electronic device 300 includes an electronic device 310, such as an integrated circuit, a discrete component, a sensor die, or any one of numerous other well-known passive or active devices, electrically coupled to a substrate 301. Substrate 301 has a top, or first, surface 309 and a bottom, or second, surface 308. In one embodiment of the invention, substrate 301 includes conductive traces 303 formed on first surface 309 of the substrate 301.

According to the one embodiment of the invention shown in FIG. 3, electronic device 310 is attached to conductive traces 303 via a flip-chip attachment in attachment region 380 of first surface 309 of substrate 301. Flip-chip methods and structures are well known in the art and are not discussed in further detail herein to avoid detracting from the invention.

In one embodiment of the invention, conductive traces 303 on first surface 309 of substrate 301 are connected to contact pads 307 formed on second surface 308 of substrate 301 by way of electrically conductive vias 305. Methods and structures for forming contact pads 307 and electrically conductive vias 305 are well known in the art and are not discussed in further detail herein to avoid detracting-from the invention.

According to one embodiment of the invention, once electronic device 310 is attached to substrate 301 and electrically connected to conductive traces 303 in a flip-chip configuration, electronic device 310, region 380 and at least a portion of first surface 309 of substrate 301, are encased in encapsulant 329 using various well known techniques and materials including over molding, injection molding or by various other structures and/or methods well known to those of skill in the art.

In another embodiment of the invention, once electronic device 310 is attached to substrate 301 and electrically connected to conductive traces 303 in a flip-chip configuration, electronic device 310, region 380 and at least a portion of first surface 309 of substrate 301, are encased in an enclosure (not shown) such as a ceramic enclosure or snap enclosure using various methods and structures well known in the art.

According to one embodiment of the invention, connection contacts 320 are then formed on contact pads 307 on second surface 308 of substrate 301. According to one embodiment of the invention, and in contrast to the prior art, the connection contacts are typically not solder contacts but are formed of hard metal such as nickel/aluminum plated copper and are therefore harder, less malleable and less subject to deformation than solder balls of the prior art.

In addition, according to one embodiment of the invention, and in contrast to the prior art, connection contacts 320 are not solder "balls" but are formed to have relatively wide bases 360 at contact pads 307 and points 361 on the opposite ends. In this embodiment of the invention, a side 363 of a connection contact 320 is at an angle 367 to a line 365 perpendicular to second surface 308 of substrate 301. As discussed in more detail below, in other embodiments of the invention, connection contacts 320 are formed to be substantially cone, pyramid, column, sphere shaped or any other shape deemed advantageous for a particular application.

FIG. 4 shows an enlarged cross-sectional view of packaged electronic device 300 coupled to a second system component 410, such as a motherboard or other system component, in accordance with one embodiment of the invention. As seen in FIG. 4, connection contacts 320 formed on contact pads 307 of second surface 308 of substrate 301 of packaged electronic device 300 are formed to align with, and contact, attachment pads 411 formed on second system component 410. In one embodiment of the invention, attachment pads 411 are formed of relatively soft material such as gold. In other embodiments of the invention, attachment pads 411 are formed of any electrically conductive material such as copper or nickel/aluminum plated copper.

In addition, according to the invention, packaged electronic device 300 is coupled to second system component 410 with a tension device 401. According to the invention, tension device 401 is used for mechanically attaching, i.e., attaching by static pressure and friction, packaged electronic device 300 of the invention to second system component 410 by providing downward pressure on first surface 330 of packaged electronic device 300. Tension device 301 thereby maintains contact between connection contacts 320 of packaged electronic device 300 and attachment pads 411 of second system component 410. In one embodiment of the invention, tension device 401 includes contact portion 407 that contacts and applies pressure to first surface 330 of packaged electronic device 300. In one embodiment of the invention, tension device 401 also includes sides 403 and anchor portions 405. According to one embodiment of the invention, second system component 410 includes holes 413 through which anchors 405 and a portion of sides 403 pass. Anchors 405 then contact surfaces 450 and clip tension device 401 to second system component 410. Tension device 401 thereby holds packaged electronic device 300, in place and, forces contact between connection contacts 320 of packaged electronic device 300 and attachment pads 411 of second system component 410. In one embodiment of the invention, point 361 is held in contact with, and in one embodiment extends into, attachment pad 411 by tension device 401.

In one embodiment of the invention, tension device 401 is formed of a metal having a relatively stiff structure and spring like quality. In other embodiments of the invention, tension device 401 is made of plastic, epoxy resin, various polymers or any other material that is relatively rigid but flexible and can provide a downward pressure.

Although the embodiments of the invention discussed above with respect to FIGS. 3 and 4 show a Flip-Chip method for attaching electronic device 310 to substrate 301, those of skill in the art will readily recognize that other methods and structures for attaching electronic device 310 to substrate 301 could be used with the invention such as wire bonding (see FIGS. 1, 2A and 2B, discussed above).

As discussed above, the prior art structures and methods required not only the formation of solder balls, but also the re-flowing of the solder balls to either attach or remove the prior art packaged electronic device from the motherboard or other second system component. Consequently, the attachment and/or removal of prior art packaged electronic devices was difficult to perform in the field, relatively expensive and the electrical contacts so formed were unreliable, sensitive and easily broken.

In contrast, according to the invention, the packaged electronic devices 100 and 300 are statically attached to second system components 210 and 410, or any other system component, without the use of solder balls or the need to re-flow solder. Therefore, using the method and structure of the invention, there is no need for specialized equipment to attach or remove packaged electronic devices 100 and 300 and these procedures can be performed easily in the field.

In addition, the electrical connection contacts 120 and 320 of the invention are more rugged and less susceptible to environmental conditions than prior art structures and methods and therefore the method and structure of the invention allows for greater reliability and results in a more robust system. Consequently, the invention provides a simpler, less expensive, more reliable and more field accessible method and structure for connecting packaged electronic devices 100 and 300 to motherboard or other second system component 210 and 410 than the methods and structures of the prior art.

As also discussed above, the connection contacts (120 in FIG. 1 and 320 in FIG. 3) of the invention can be formed in any shape desired and/or suited to a particular application of the method and structure of the invention. As an example, FIGS. 5A, 5B, 6A and 6B show examples of embodiments of the invention with column and spherical connection contacts 520 and 620, respectively.

FIG. 5A shows an enlarged cross-sectional view of another embodiment of the invention. In FIG. 5A, packaged electronic device 100 of FIG. 1 is coupled to second system component 210, or other system component as described in more detail above with respect to FIGS. 1 and 2A. As seen in FIG. 5A, connection contacts 520 formed on contact pads 107 of second surface 108 of substrate 101 of packaged electronic device 100 are not solder "balls" but are formed in a column or rectangular shape.

As discussed above, according to the invention, packaged electronic device 100 is coupled to second system component 210 with a tension device 201. According to the invention, tension device 201 is used for mechanically attaching, i.e., attaching by static pressure and friction, packaged electronic device 100 of the invention to the second system component 210 by providing downward pressure on. first surface 130 of packaged electronic device 100. Tension device 201 thereby maintains contact between connection contacts 520 of packaged electronic device 100 and attachment pads 211 of second system component 210.

FIG. 5B shows a close up and detailed view of portion 550 in FIG. 5A including connection contact 520 and base width 560 of connection contact 520. Although the embodiment of the invention discussed above with respect to FIGS. 5A and 5B show a wire bond method for attaching electronic device 110 to substrate 101, those of skill in the art will readily recognize that other methods and structures for attaching electronic device 110 to substrate 101 could be used with the invention such as Flip-chip methods (see FIGS. 3 and 4 discussed above).

FIG. 6A shows an enlarged cross-sectional view of another embodiment of the invention. In FIG. 6A, packaged electronic device 300 of FIG. 3 is coupled to second system component 410, or other system component as described in more detail above with respect to FIGS. 3 and 4. As seen in FIG. 6A, connection contacts 620 formed on contact pads 307 of second surface 308 of substrate 301 of packaged electronic device 300 are formed to be spherical in shape. However, in contrast to the prior art, connection contacts 620 are typically not solder contacts but are formed of hard metal such as nickel/aluminum plated copper and are therefore harder, less malleable and less subject to deformation than prior art solder balls.

Figure 6B:
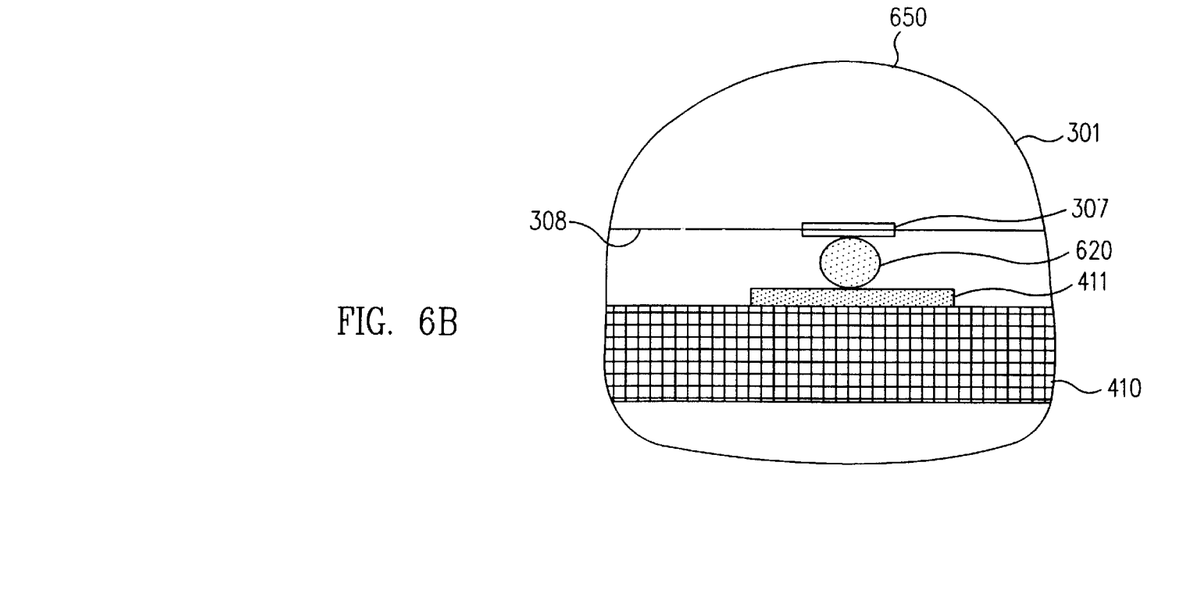
FIG. 6B shows a close up and detailed view of a portion of the structure shown FIG. 6A.

FIG. 6B shows a close up and detailed view of portion 650 in FIG. 6A including connection contact 620. Although the embodiment of the invention discussed above with respect to FIGS. 6A and 6B shows a Flip-Chip method for attaching electronic device 310 to substrate 301, those of skill in the art will readily recognize that other methods and structures for attaching electronic device 310 to substrate 301 could be used with the invention such as wire bonding (see FIGS. 1, 2A and 2B, discussed above).

As noted above, although specific shapes for connection contacts 120, 320, 520 and 620 are shown in the FIGS., any shape desired for a particular purpose can be used with the method and structure of the invention including, but not limited to, square, rectangular, pyramidal, conical, column, trapezoidal, triangular or spherical.

As discussed above, according to one embodiment of the invention, connection contacts are formed on the contact pads on the second surface of the packaged electronic device substrate. According to one embodiment of the invention, and in contrast to the prior art, the connection contacts are typically not solder contacts but are formed of hard metal such as nickel/aluminum plated copper and are therefore harder, less malleable and less subject to deformation than the solder balls used in the prior art. In addition, according to one embodiment of the invention, and in contrast to the prior art, the connection contacts are not solder "balls" but, in one embodiment, are formed to have relatively wide bases at the contact pads and points on the opposite ends. In one embodiment of the invention, the connection contacts are formed to be substantially conical in shape with a relatively wide base at the contact pad and a relatively narrow point at the opposite end. In one embodiment of the invention, the connection contacts are formed to be substantially pyramid shaped with a relatively wide base at the contact pad and a relatively narrow point at the opposite end. In one embodiment of the invention, the connection contacts are formed to be substantially column shaped. Intone embodiment of the invention, the connection contacts are formed to be substantially square or rectangular shaped. In one embodiment of the invention, the connection contacts are formed to be substantially spherical shaped or any other shape desired or considered advantageous in a particular structure or application.

According to one embodiment of the invention, the connection contacts formed on the contact pads of the second surface of the substrate of the packaged electronic device of the invention are formed to align with, and contact, attachment pads formed on the motherboard or other second system component. In addition, according to one embodiment of the invention, the packaged electronic device of the invention includes a tension device for mechanically attaching, i.e., attaching by static pressure and friction, the packaged electronic device of the invention to the second system component. According to one embodiment of the invention, the tension device applies a pressure on the packaged electronic device and maintains contact between the connection contacts of the packaged electronic device of the invention and the attachment pads of the motherboard or other second system component.

As discussed above, the prior art structures and methods required not only the formation of solder balls, but also the re-flowing of the solder balls to either attach or remove the prior art packaged electronic device from the motherboard or other second system component. Consequently, the attachment and/or removal of prior art packaged electronic devices was difficult to perform in the field, relatively expensive and the electrical contacts so formed were unreliable, sensitive and easily broken.

In contrast, according to the invention, the packaged electronic devices are statically attached to the motherboard, or any other second system component, without the use of solder balls or the need to re-flow solder. Therefore, using the method and structure of the invention, there is no need for specialized equipment to attach or remove packaged electronic devices and these procedures can be performed easily in the field.

In addition, the electrical connection contacts of the invention are more rugged and less susceptible to environmental conditions than prior art structures and methods and therefore the method and structure of the invention allows for greater reliability and results in a more robust system. Consequently, the invention provides a simpler, less expensive, more reliable and more field accessible method and structure for connecting packaged electronic devices to a motherboard or other second system component than the methods and structures of the prior art.

This application is related to co-filed and commonly assigned U.S. patent application Ser. No. 09/085,136 entitled "METHOD FOR INTERGRATED CIRCUIT PACKAGE MOUTING" which is herein incorporated by reference in its entirety.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

For instance, in the discussion above, specific shapes for connection contacts 120, 320, 520 and 620 are shown in the FIGS. However, those of skill in the art will recognize that any shape desired for a particular purpose can be used with the method and structure of the invention including, but not limited to, square, rectangular, pyramidal, conical, column, trapezoidal, triangular or spherical. Consequently, the scope of the present invention is not limited by the exemplary embodiments shown in the FIGS.

What is claimed is:

1. A mounted packaged electronic device comprising:
   a packaged electronic device, said packaged electronic device comprising:
      a substrate, said substrate comprising a substrate first surface and a substrate second surface, said substrate second surface being opposite said substrate first surface;
      a device attachment region formed on said substrate first surface;
      electrically conductive traces formed on said substrate first surface, said electrically conductive traces comprising bonding locations;
      an electronic device, said electronic device having an electronic device first surface and an electronic device second surface, opposite said electronic device first surface, said electronic device second surface being attached to said substrate first surface in said device attachment region, said electronic device being electrically coupled by bond wires to said bonding locations of said electrically conductive traces on said substrate first surface;
      a plurality of connection pads, each of said connection pads being formed on said substrate second surface, each of said connection pads being electrically coupled to corresponding ones of said electrically conductive traces formed on said substrate first surface;

hard metal connection contacts formed on said connection pads, said hard metal connection contacts being formed of electrically conductive nickel/aluminum plated copper to be a predetermined shape;

a second system component, said second system component having a second system component first surface and a second system component second surface, opposite said second system component first surface;

attachment pads formed on said second system component first surface; and a tension device, said tension device coupling said packaged electronic device to said second system component such that said substrate second surface is facing said second system component first surface and said connection contacts formed on said connection pads on said substrate second surface are made to physically and electrically contact said corresponding ones of said attachment pads formed on said second system component first surface.

2. The mounted packaged electronic device of claim 1, wherein;

said hard metal connection contacts are formed to be substantially conical in shape.

3. The mounted packaged electronic device of claim 1, wherein;

said hard metal connection contacts are formed to be substantially pyramidal in shape.

4. A packaged electronic device comprising:

a substrate, said substrate comprising a substrate first surface and a substrate second surface, said substrate second surface being opposite said substrate first surface;

a device attachment region formed on said substrate first surface;

electrically conductive traces formed on said substrate first surface;

an electronic device, said electronic device having an electronic device first surface and an electronic device second surface, opposite said electronic device first surface, said electronic device first surface being attached to said substrate first surface in said device attachment region in a flip-chip configuration, said electronic device thereby being electrically coupled said electrically conductive traces on said substrate first surface;

a plurality of connection pads, each of said connection pads being formed on said substrate second surface, each of said connection pads being electrically coupled to corresponding ones of said electrically conductive traces formed on said substrate first surface; and hard metal connection contacts formed on said connection pads, said hard metal connection contacts being formed of electrically conductive nickel/aluminum plated copper to be a predetermined shape.

5. The packaged electronic device of claim 4, wherein;

said hard metal connection contacts are formed to be substantially conical in shape.

6. The packaged electronic device of claim 4, wherein;

said hard metal connection contacts are formed to be substantially pyramidal in shape.

7. A mounted packaged electronic device comprising:

a packaged electronic device, said packaged electronic device comprising:

a substrate, said substrate comprising a substrate first surface and a substrate second surface, said substrate second surface being opposite said substrate first surface;

a device attachment region formed on said substrate first surface;

electrically conductive traces formed on said substrate first surface, said electrically conductive traces comprising bonding locations;

an electronic device, said electronic device having an electronic device first surface and an electronic device second surface, opposite said electronic device first surface, said electronic device first surface being attached to said substrate first surface in said device attachment region in a flip-chip configuration, said electronic device thereby being electrically coupled said electrically conductive traces on said substrate first surface;

a plurality of connection pads, each of said connection pads being formed on said substrate second surface, each of said connection pads being electrically coupled to corresponding ones of said electrically conductive traces formed on said substrate first surface;

hard metal connection contacts formed on said contacts being formed of electrically conductive nickel/aluminum plated copper to be a predetermined shape;

a second system component, said second system component having a second system component first surface and a second system component second surface, opposite said second system component first surface;

attachment pads formed on said second system component first surface; and a tension device, said tension device coupling said packaged electronic device to said second system component such that said substrate second surface is facing said second system component first surface and said connection contacts formed on said connection pads on said substrate second surface are made to physically and electrically contact said corresponding ones of said attachment pads formed on said second system component first surface.

8. The mounted packaged electronic device of claim 7, wherein;

said hard metal connection contacts are formed to be substantially conical in shape.

9. The mounted packaged electronic device of claim 7, wherein;

said hard metal connection contacts are formed to be substantially pyramidal in shape.

10. A mounted packaged electronic device comprising:

a packaged electronic device, the packaged electronic device comprising:

a substrate, the substrate comprising a substrate first surface and a substrate second surface;

a device attachment region formed on the substrate first surface;

electrically conductive traces formed on the substrate first surface;

an electronic device, the electronic device having an electronic device first surface and an electronic device second surface, the electronic device second surface being attached to the, substrate first surface in the device attachment region, the electronic device being electrically coupled by bond wires to bonding locations on the substrate first surface;

a plurality of connection pads, each of the connection pads being formed on the substrate second surface, each of the connection pads being electrically coupled to corresponding ones of the electrically conductive traces formed on the substrate first surface;

connection contacts formed on the connection pads, the connection contacts being formed of electrically conductive nickel/aluminum plated copper to be a predetermined shape;

a second system component, the second system component having a second system component first surface and a second system component second surface;

attachment pads formed on the second system component first surface; and a tension device, the tension device coupling the packaged electronic device to the second system component such that the substrate second surface is facing the second system component first surface and the connection contacts on the substrate second surface are made to physically and electrically contact the corresponding ones of the attachment pads formed on the second system component first surface.

11. The mounted packaged electronic device of claim 10, wherein;

the connection contacts are formed to be substantially conical in shape.

12. The mounted packaged electronic device of claim 10, wherein;

the connection contacts are formed to be substantially pyramidal in shape.

13. A packaged electronic device comprising:

a substrate, the substrate comprising a substrate first surface and a substrate second surface;

a device attachment region formed on the substrate first surface;

electrically conductive traces formed on the substrate first surface;

an electronic device, the electronic device having an electronic device first surface and an electronic device second surface, the electronic device first surface being attached to the substrate first surface in the device attachment region in a flip-chip configuration, the electronic device thereby being electrically coupled to the electrically conductive traces on the substrate first surface;

a plurality of connection pads, each of the connection pads being formed on the substrate second surface, each of the connection pads being electrically coupled to corresponding ones of the electrically conductive traces formed on the substrate first surface; and connection contacts formed on the connection pads, the connection contacts being formed of electrically conductive nickel/aluminum plated copper to be a predetermined shape.

14. The packaged electronic device of claim 13, wherein;

the connection contacts are formed to be substantially conical in shape.

15. The packaged electronic device of claim 13, wherein;

the connection contacts are formed to be substantially pyramidal in shape.

16. A mounted packaged electronic device comprising:

a packaged electronic device, the packaged electronic device comprising:

a substrate, the substrate comprising a substrate first surface and a substrate second surface;

a device attachment region formed on the substrate first surface;

electrically conductive traces formed on the substrate first surface, the electrically conductive traces comprising bonding locations;

an electronic device, the electronic device having an electronic device first surface and an electronic device second surface, the electronic device first surface being attached to the substrate first surface in the device attachment region in a flip-chip configuration, the electronic device thereby being electrically coupled the electrically conductive traces on the substrate first surface;

a plurality of connection pads, each of the connection pads being formed on the substrate second surface, each of the connection pads being electrically coupled to corresponding ones of the electrically conductive traces formed on the substrate first surface;

connection contacts formed on the connection pads, the connection contacts being formed of electrically conductive nickel/aluminum plated copper to be a predetermined shape;

a second system component, the second system component having a second system component first surface and a second system component second surface;

attachment pads formed on the second system component first surface; and a tension device, the tension device coupling the packaged electronic device to the second system component such that the substrate second surface is facing the second system component first surface and the connection contacts formed on the connection pads on the substrate second surface are made to physically and electrically contact the corresponding ones of the attachment pads formed on the second system component first surface.

17. The mounted packaged electronic device of claim 16, wherein;

the connection contacts are formed to be substantially conical in shape.

18. The mounted packaged electronic device of claim 16, wherein;

the connection contacts are formed to be substantially pyramidal in shape.

* * * * *